US010230357B1

United States Patent
Namai et al.

(10) Patent No.: US 10,230,357 B1
(45) Date of Patent: Mar. 12, 2019

(54) GATE CONTROL CIRCUIT

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventors: Atsushi Namai, Kanagawa (JP); Junichi Todaka, Oita (JP); Shuji Toda, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 15/901,606

(22) Filed: Feb. 21, 2018

(30) Foreign Application Priority Data

Sep. 6, 2017 (JP) ................ 2017-171468

(51) Int. Cl.
*H03K 3/012* (2006.01)
*H03K 17/687* (2006.01)
*H03K 3/037* (2006.01)
*H03K 5/00* (2006.01)
*H03K 19/0185* (2006.01)

(52) U.S. Cl.
CPC ............ *H03K 3/012* (2013.01); *H03K 3/037* (2013.01); *H03K 17/687* (2013.01); *H03K 19/0185* (2013.01); *H03K 5/00* (2013.01); *H03K 2005/00013* (2013.01)

(58) Field of Classification Search
CPC ............ H03K 17/00; H03K 17/04126; H03K 17/063; H03K 17/0826; H03K 17/601; H03K 17/687; H03K 19/00; H03K 19/0185; H03K 2005/00; H03K 2005/00013; H03K 2217/00; H03K 2217/0036; H03K 3/00; H03K 3/012; H03K 3/037; H03K 5/00
USPC ........................................................ 327/109
See application file for complete search history.

(56) References Cited

U.S. PATENT DOCUMENTS

| 6,538,480 | B2 | 3/2003 | Takada et al. |
| 8,547,142 | B2 | 10/2013 | Nakahara et al. |
| 2011/0241738 | A1 | 10/2011 | Tamaoka |

(Continued)

FOREIGN PATENT DOCUMENTS

| JP | 2002100972 A | 4/2002 |
| JP | 2011211836 A | 10/2011 |
| JP | 2012109937 A | 6/2012 |

*Primary Examiner* — Lincoln Donovan
*Assistant Examiner* — David Mattison
(74) *Attorney, Agent, or Firm* — Holtz, Holtz & Volek PC (57) ABSTRACT

According to one embodiment, a gate control circuit includes a controller, a delay circuit, a power circuit, a boosting circuit, a first transistor, and a control circuit. The controller outputs first and second control signals based on a control signal from outside. The delay circuit delays the first control signal. The power circuit is capable of controlling a power supply voltage to be output based on the delayed first control signal. The boosting circuit is capable of boosting and outputting an input voltage. The first transistor has one end connected to an output node of the boosting circuit, and the other end grounded. The control circuit is capable of controlling a gate voltage of the first transistor based on the second control signal.

12 Claims, 8 Drawing Sheets

(56) References Cited

U.S. PATENT DOCUMENTS

| | | | |
|---|---|---|---|
| 2012/0098587 A1* | 4/2012 | Nakahara | H03K 17/08122 327/425 |
| 2012/0194226 A1* | 8/2012 | Itou | H03K 17/168 327/109 |
| 2014/0159778 A1* | 6/2014 | Hirano | H03K 17/223 327/109 |
| 2015/0236686 A1* | 8/2015 | Senda | H03K 17/0828 327/381 |

* cited by examiner

GATE CONTROL CIRCUIT

CROSS-REFERENCE TO RELATED APPLICATIONS

This application is based upon and claims the benefit of priority from Japanese Patent Application No. 2017-171468, filed Sep. 6, 2017, the entire contents of which are incorporated herein by reference.

FIELD

Embodiments described herein relate generally to a gate control circuit of a MOSFET.

BACKGROUND

A gate control circuit that is capable of controlling a current flowing between an input and an output by controlling a MOSFET connected between the input and the output is known.

DETAILED DESCRIPTION

A gate control circuit of an embodiment comprises a controller, a delay circuit, a power circuit, a boosting circuit, a first transistor, and a control circuit. The controller outputs first and second control signals based on a control signal from outside. The delay circuit delays the first control signal. The power circuit is capable of controlling a power supply voltage to be output based on the delayed first control signal. The boosting circuit is capable of boosting and outputting an input voltage. The first transistor has one end connected to an output node of the boosting circuit, and the other end grounded. The control circuit is capable of controlling a gate voltage of the first transistor based on the second control signal.

Hereinafter, the embodiment will be explained with reference to the accompanying drawings. The drawings are schematic views. In the explanation below, structural elements having substantially the same functions and configurations will be denoted by the same reference symbols, in order to avoid redundant explanations.

[1] EMBODIMENT

Hereinafter, a gate control circuit according to an embodiment will be explained.

[1-1] Configuration

Figure 1:
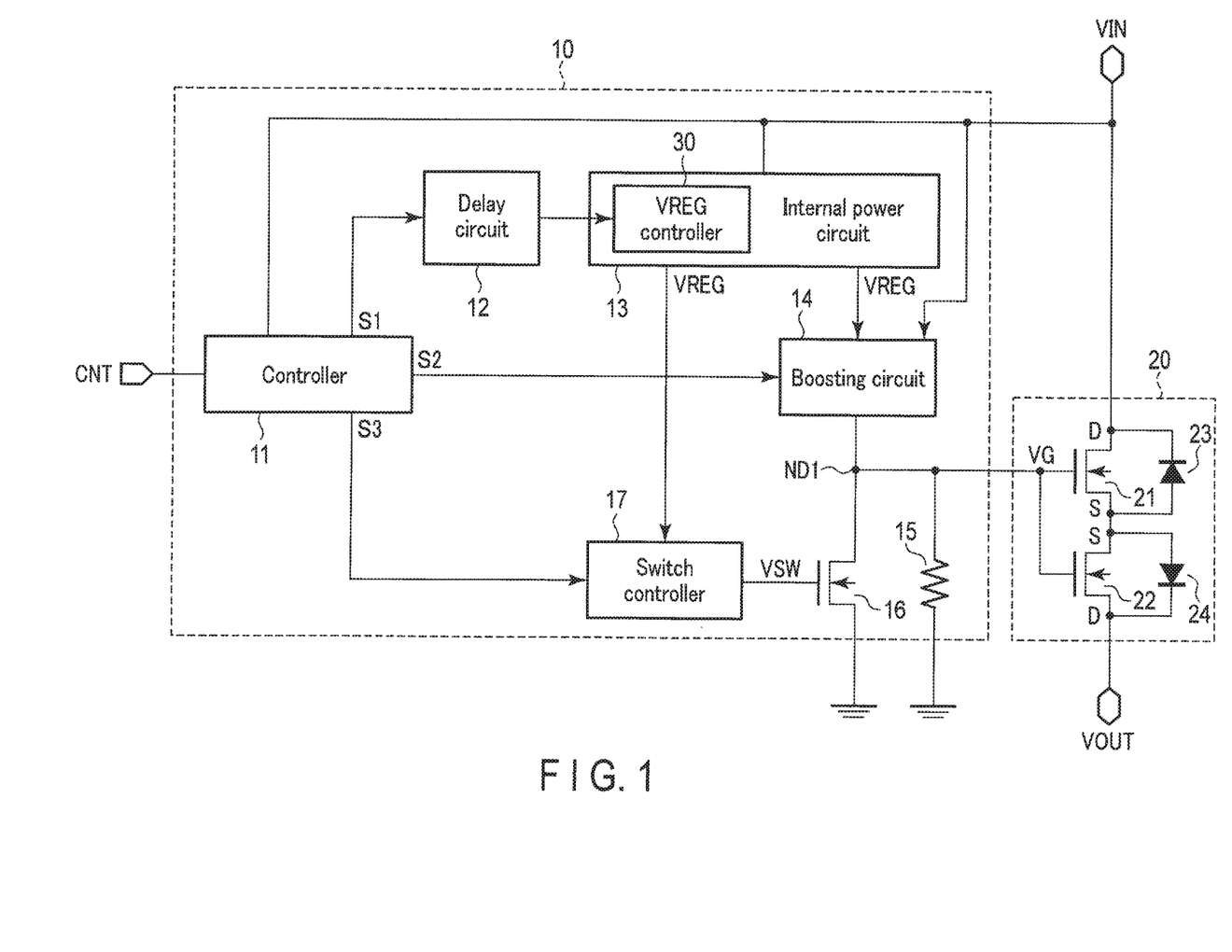
FIG. 1 is a block diagram showing a configuration example of a gate control circuit and an output part according to an embodiment.

FIG. 1 shows a configuration example of a gate control circuit 10 and an output part 20 according to the embodiment. As shown in FIG. 1, the gate control circuit 10 comprises a controller 11, a delay circuit 12, an internal power circuit 13, a boosting circuit 14, a pull-down resistor 15, a transistor 16, and a switch controller 17.

The controller 11 is operated based on a power supply voltage supplied from an input VIN, and is capable of controlling an operation of the entire gate control circuit 10. The controller 11 is also capable of generating each of a control signal S1 that controls the internal power circuit 13, a control signal S2 that controls the boosting circuit 14, and a control signal S3 that controls the switch controller 17 based on, for example, a control signal CNT from an external device.

The delay circuit 12 is connected between the controller 11 and the internal power circuit 13, and delays the control signal S1 generated by the controller 11. The delay circuit 12 inputs the delayed control signal S1 to the internal power circuit 13.

The internal power circuit 13 is capable of supplying an internal power supply voltage in the gate control circuit 10. Specifically, the internal power circuit 13 is capable of generating an internal power supply voltage VREG using the power supply voltage supplied from the input VIN, and supplying the generated voltage to, for example, the boosting circuit 14 and the switch controller 17. The internal power circuit 13 further includes a VREG controller 30. The VREG controller 30 is capable of suppressing a consumption current of the internal power circuit 13 based on the control signal S1 that has been delayed by the delay circuit 12.

The boosting circuit 14 boosts the internal power supply voltage VREG as the power supply voltage based on the control signal S2 generated by the controller 11, and generates a boosting voltage. Then, a voltage VG obtained by adding the boosting voltage to the input VIN is output. The internal power supply voltage VREG is a circuit whose variance caused by the variation in temperature and process is reduced. By the internal power supply voltage VREG being the power supply voltage of the boosting circuit 14, the variation in the boosting voltage becomes small. The output node of the boosting circuit 14 is connected to a node ND1.

The pull-down resistor 15 is a resistance element that has been added to prevent the node ND1 from becoming a floating state when the output part 20 becomes an OFF-state, or the input VIN becomes 0V, and pulls down a node VG. One end of the pull-down resistor 15 is connected to the node VG, and the other end of the pull-down resistor 15 is grounded. When the boosting circuit 14 is in operation, a current is always supplied to the pull-down resistor 15. In order to reduce degradation of the boosting ability of the boosting circuit 14, the pull-down resistor 15 is configured by a large resistance that is, for example, approximately 5MΩ.

The transistor 16 is, for example, an NMOS transistor, and is capable of controlling a voltage of the node ND1 based on the control of the switch controller 17. A drain of the transistor 16 is connected to the node ND1, and a source of the transistor 16 is grounded. A gate of the transistor 16 is connected to the switch controller 17.

The switch controller 17 is a logic circuit that operates by being supplied with the internal power supply voltage VREG. The switch controller 17 is capable of controlling a voltage VSW to be applied to the gate of the transistor 16 based on the control signal S3 generated by the controller 11.

The output part 20 is connected between the input VIN and an output VOUT, and includes transistors 21 and 22 that are connected in series. Transistors 21 and 22 are, for example, NMOS transistors, and are configured to have the sources face each other (Back to Back). This configuration serves as a measure against a reverse current in the case where the voltage of the input VIN is lower than the voltage of the output VOUT. For example, as shown in FIG. 1, the NMOS transistors 21 and 22 include inner parasitic diodes 23 and 24, respectively, in which the source is an anode, and the drain is a cathode. In the case of a single NMOS transistor, when the voltage of the input VIN is lower than the voltage of the output VOUT, a reverse current is supplied from the source of the NMOS transistor through the inner parasitic diode. In contrast, in a configuration where the sources of the two NMOS transistors 21 and 22 face each other, the drain of the NMOS transistor 22 on the output VOUT side is connected to the output VOUT. This allows the inner parasitic diode 24 to be formed in a direction the reverse current is difficult to flow, thereby, allowing the current from the output VOUT towards the input VIN to be suppressed. The gates of the NMOS transistors 21 and 22 are connected to the node ND1, and change to an ON state or an OFF state based on a voltage value of the node ND1. In other words, the output part 20 is capable of controlling the connection (ON/OFF) between the input VIN and the output VOUT by the gate control circuit 10 controlling the voltage VG to be applied to the NMOS transistors 21 and 22. In the case where there is no prescribed reverse current, the configuration of the output part 20 in the embodiment is not limited thereto, and may be designed with a single NMOS transistor. In this case, the drain of the NMOS transistor is connected to the input VIN, and the source of the NMOS transistor is connected to the output VOUT.

Figure 2:
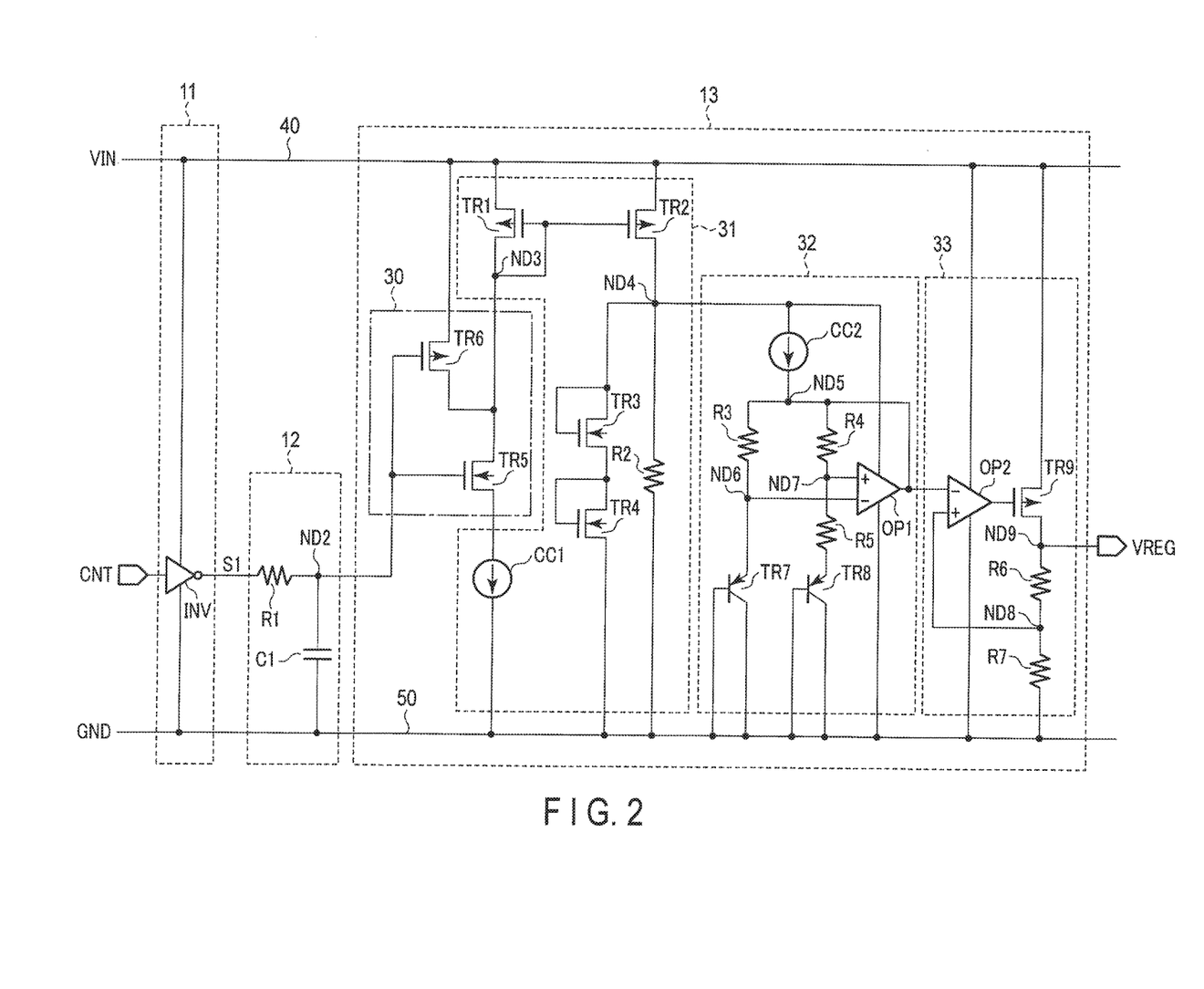
FIG. 2 shows an example of a circuit configuration of a controller, a delay circuit, and an internal power circuit included in the gate control circuit according to the embodiment.

A specific circuit configuration of the gate control circuit 10 will be explained using FIG. 2. FIG. 2 shows an example of circuit configurations of the controller 11, the delay circuit 12, and the internal power circuit 13 included in the gate control circuit 10 according to the embodiment. As shown in FIG. 2, the controller 11 includes an inverter INV, the delay circuit 12 includes a resistor element R1 and a capacitive element C1, and the internal power circuit 13 further includes a voltage supply circuit 31, a BGR (Band Gap Reference) circuit 32, and an LDO (Low Drop Out) circuit 33. FIG. 2 additionally shows a power supply wire 40 connected to the input VIN, and a ground wire 50 connected to a GND.

In the controller 11, the inverter INV operates based on a potential difference between the power supply wire 40 and the ground wire 50, and the control signal CNT is input thereto from an external device. The inverter INV inverses the input control signal CNT, and outputs the inversed control signal CNT to the delay circuit 12 as the control signal S1.

In the delay circuit 12, one end of the resistor element R1 is connected to an output of the inverter INV, and the other end of the resistor element R1 is connected to a node ND2. One end of the capacitive element C1 is connected to the node ND2, and the other end of the capacitive element C1 is connected to the ground wire 50. A resistance value of the resistor element R1 and a capacity of the capacitive element C1 are designed so that a delay time of the control signal S1 transmitted through the delay circuit 12 becomes a desired delay time.

In the internal power circuit 13, the voltage supply circuit 31 is a circuit that generates a voltage to be supplied to the BGR circuit 32. The voltage supply circuit 31 includes, for example, transistors TR1 to TR4, a constant current source CC1, and a resistor element R2. The transistors TR1 and TR2 are, for example, PMOS transistors, and configure a current mirror circuit that can mirror a current flowing in a node ND3 to a node ND4. The sources of the transistors TR1 and TR2 are connected to the power supply wire 40. The drains of the transistors TR1 and TR2 are connected to the nodes ND3 and ND4, respectively. A gate of the transistor TR1 is connected to a gate of the transistor TR2 and the node ND3. The transistors TR3 and TR4 are, for example, NMOS transistors. A voltage of the node ND4 is determined by a substrate bias effect of the transistor TR3 (for example, 3V). A drain of the transistor TR3 is connected to a gate of the transistor TR3 and the node ND4. A drain of the transistor TR4 is connected to a gate of the transistor TR4 and a source of the transistor TR3. The source of the transistor TR4 is connected to the ground wire 50. The constant current source CC1 is connected between a source of a transistor TR5 and the ground wire 50, and adjusts the flowing current to a certain amount. The voltage supply circuit 31 is designed to increase a current to be supplied to the transistor TR2 so that the occurrence of an operational failure caused by a lack of current capacity due to element variation and temperature characteristics, etc. is suppressed when, for example, the voltage is reduced. The resistor element R2 is connected between the node ND4 and the ground wire 50. The resistor element R2 is provided to supply a current that has become redundant among the currents flowing in the node ND4.

The VREG controller 30 includes, for example, transistors TR5 and TR6. The transistor TR5 is, for example, an NMOS transistor, and the transistor TR6 is, for example, a PMOS transistor. A drain of the transistor TR5 is connected to the node ND3, a source of the transistor TR5 is connected to the constant current source CC1, and a gate of the transistor TR5 is connected to the node ND2. A source of the transistor TR6 is connected to the power supply wire 40, a drain of the transistor TR6 is connected to the node ND3, and a gate of the transistor TR6 is connected to the node ND2.

The BGR circuit 32 is a circuit for generating a constant voltage to be supplied to the LDO circuit 33. The BGR circuit 32, for example, includes a constant current source CC2, resistor elements R3 to R5, transistors TR7 and TR8, and an operational amplifier OP1. The constant current source CC2 is connected between the node ND4 and a node ND5. The resistor element R3 is connected between the node ND5 and a node ND6. The resistor element R4 is connected between the node ND5 and a node ND7. One end of the resistor element R5 is connected to the node ND7. The transistors TR7 and TR8 are, for example, a PNP-type bipolar transistor. An emitter of the transistor TR7 is connected to the node ND6, and a base and a collector of the transistor TR7 are connected to the ground wire 50. An emitter of the transistor TR8 is connected to the other end of the resistor element R5, and a base and a collector of the transistor TR8 are connected to the ground wire 50. The operational amplifier OP1 operates based on a potential difference between the node ND4 and the ground wire 50. An output of the operational amplifier OP1 is connected to the node ND5 and is fed back, so that a potential of the node ND6 and a potential of the node ND7 become the same potential. The BGR circuit 32 outputs the voltage of the node ND5 at this time to the LDO circuit 33 as a BGR output voltage (for example, 1.2V).

The LDO circuit 33 is a linear regulator in which a minimally required potential difference between the input and output is low, and outputs the internal power supply voltage VREG using the constant voltage generated by the BGR circuit 32 as a reference. The LDO circuit 33 includes, for example, an operational amplifier OP2, a transistor TR9, and resistor elements R6 and R7. The operational amplifier OP2 operates based on a potential difference between the power supply wire 40 and the ground wire 50. The operational amplifier OP2 controls a gate voltage of the transistor TR9 so that a reference voltage output from the BGR circuit and a voltage of a node ND8 become identical. The transistor TR9 is, for example, a PMOS transistor. A source of the transistor TR9 is connected to the power supply wire 40, and a drain of the transistor TR9 is connected to a node ND9. The resistor element R6 is connected between the node ND8 and the node ND9. The resistor element R7 is connected between the node ND8 and the ground wire 50.

In the configuration of the internal power circuit 13 as mentioned above, a voltage of the node ND9 is supplied to the boosting circuit 14 and the switch controller 17 as the internal power supply voltage VREG. Since a consumption current of the internal power circuit 13 is comprised of the BGR circuit 32 and the LDO circuit 33, the consumption current becomes, for example, several dozen µA.

The circuit configuration of the gate control circuit 10 is not limited to the above. For example, the internal power circuit 13 may also have other circuit configurations, as long as it includes the VREG controller 30 that is capable of suppressing the consumption current of the internal power circuit 13 based on the control signal CNT.

[1-2] Operation

Figure 3:
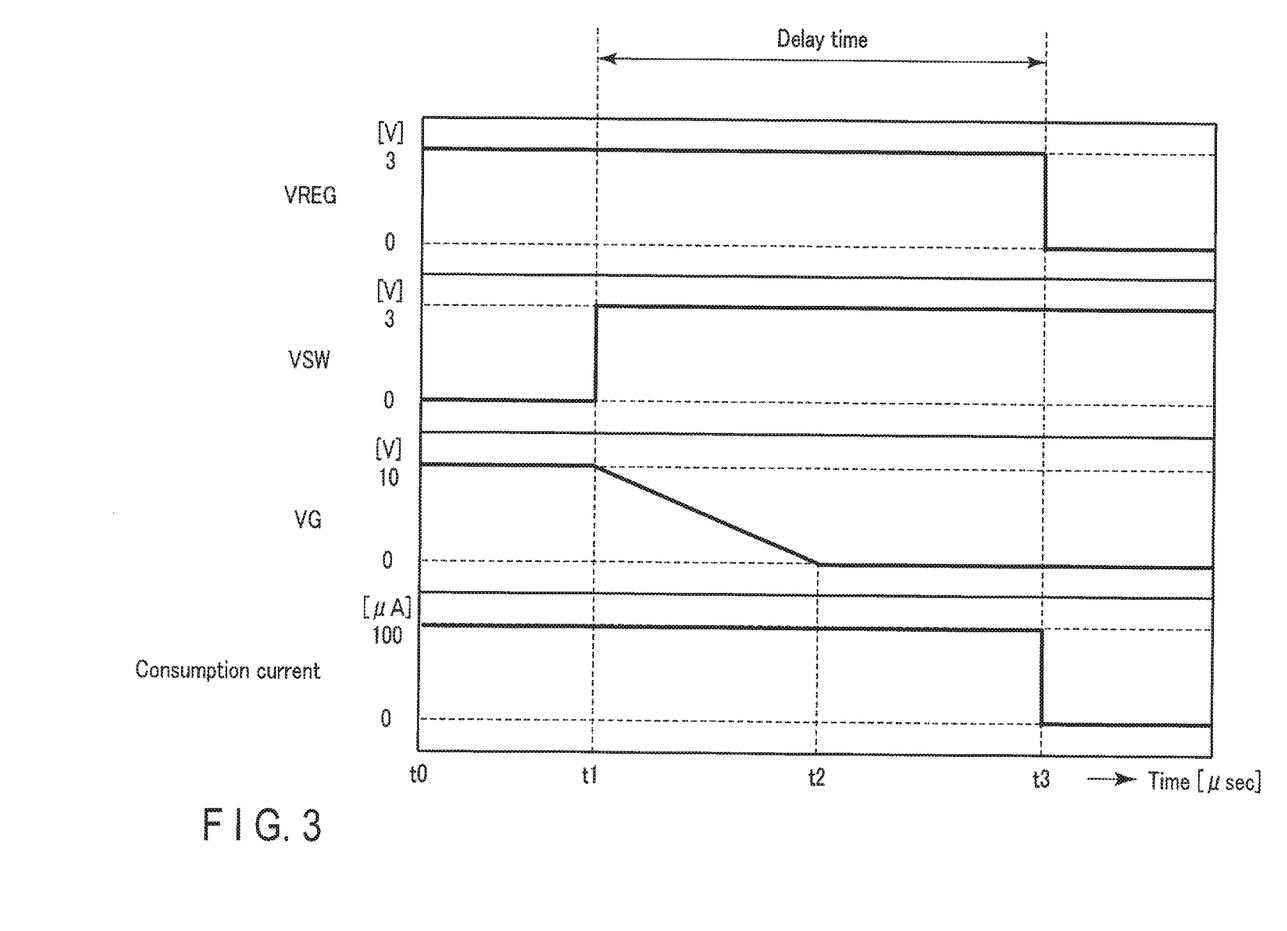
FIG. 3 is a timing chart showing an operation example of the gate control circuit according to the embodiment.

FIG. 3 is a timing chart that shows an operation example of the gate control circuit 10 according to the embodiment. The timing chart shows the voltage VSW to be applied to the gate of the transistor 16, the internal power supply voltage VREG, the voltage VG to be applied to the gates of the transistors 21 and 22, and the consumption current necessary for an internal power supply activation of the gate control circuit 10. This consumption current does not include currents flowing in the controller 11, the boosting circuit 14, and the switch controller 17. In the following explanation, level "L" corresponds to a voltage at which the PMOS transistor and the NMOS transistor become an ON-state and an OFF-state, respectively, and level "H" corresponds to a voltage at which the PMOS transistor and the NMOS transistor become an OFF-state and an ON-state, respectively. Hereinafter, a state in which the gate control circuit 10 controls the output part 20 so that a current is supplied between the input VIN and the output VOUT will be referred to as a gate-ON state. A state in which the gate control circuit 10 controls the output part 20 so that a current path is blocked between the input VIN and the output VOUT will be referred to as a gate-OFF state.

As shown in FIG. 3, at time t0, the gate control circuit 10 is in a gate-ON state. Specifically, the controller 11 generates control signals S1, S2, and S3 based on the control signal CNT that instructs the gate-ON state. Here, based on the control signal S1, a level "H" voltage is applied to the gates of the transistors TR5 and TR6 that are included in the VREG controller 30 of the internal power circuit 13, and the transistors TR5 and TR6 become an ON-state and an OFF-state, respectively. In this manner, a current path is formed between the node ND3 and the constant current source CC1, and the voltage supply circuit 31, the BGR circuit 32, and the LDO circuit 33 are operated. The internal power circuit 13, for example, supplies 3V of the internal power supply voltage VREG to the boosting circuit 14 and the switch controller 17. The switch controller 17 sets the voltage VSW to level "L" based on the control signal S3. The transistor 16 to which gate a level "L" voltage is applied is in an OFF-state. Based on the control signal S2, the boosting circuit 14 applies a voltage obtained by boosting the internal power supply voltage VREG to the gates of the transistors 21 and 22. In the case where VIN=5V, the voltage VG, for example, becomes 10V. For the NMOS transistor of the output part 20 to become an ON-state, for example, a voltage VG that is approximately an input VIN+3V~10V would be necessary. The voltage thereof would change based on the characteristics of the selected NMOS transistor and a value of the input VIN. For example, the transistors 21 and 22 to which 10V of the voltage VG is applied are in an ON-state, and the output part 20 forms a current path between the input VIN and the output VOUT. In this state, a consumption current that is required for the internal power supply activation of the gate control circuit 10 is, for example, 100 µA.

At time t1, an external device uses the control signal CNT to instruct the gate control circuit 10 to shift from the gate-ON state to the gate-OFF state. The controller 11 then generates the control signals S1, S2, and S3 based on the control signal CNT that instructs the gate-OFF state. Based on the control signal S2, the boosting circuit 14 stops boosting the internal power supply voltage VREG, and stops applying the boosted voltage to the node ND1. Based on the control signal S3, the switch controller 17 raises the voltage VSW from level "L" to level "H". When the gate becomes level "H", the transistor 16 becomes an ON-state, in which a current path is formed between the node ND1 and the GND, and the voltage of the node ND1 starts to drop. Here, since the control signal S1 generated by the controller 11 is delayed by the delay circuit 12, the voltage applied to the gates of the transistors TR5 and TR6 is maintained at level "H".

At time t2, the voltage VG that has been dropping from time t1 becomes, for example, 0V. A falling time of the voltage VG between the times t1 and t2 becomes a time constant based on gate capacities of the transistors 21 and 22 and an ON-resistance of the transistor 16. In other words, the falling time of the gate voltage of the transistors 21 and 22 is based on the gate capacities of the transistors 21 and 22 and the ON-resistance of the transistor 16.

At time t3, the change in the control signal S1 with respect to the internal power circuit 13 is transmitted to the gates of the transistors TR5 and TR6, and the voltage applied to the gates of the transistors TR5 and TR6 becomes level "L" from level "H". The transistors TR5 and TR6 then become an OFF-state and an ON-state, respectively, which blocks the current path between the node ND3 and the constant current source CC1, and fixes, by the transistor TR6, the potential of the node ND3 to level "H". Therefore, the transistors TR1 and TR2 become an OFF-state, and the voltage supply circuit 31 stops supplying the current to the BGR circuit 32 and the LDO circuit 33. The internal power supply voltage VREG then becomes, for example, 0V, and the consumption current of the gate control circuit 10 becomes, for example, 0 μA.

The numeric values used in the above explanation are only examples, and are not limited thereto. For example, the voltage values of the voltages VSW, VREG, and VG, etc. change as appropriate based on the circuit configurations of the input VIN, the gate control circuit 10, and the output part 20, and the characteristics of the transistor, etc.

In the above explanation, a case in which the gate control circuit 10 shifts from the gate-ON state to the gate-OFF state has been mentioned. However, the gate control circuit 10 is also able to shift from the gate-OFF state to the gate-ON state. In this case, based on the control signal CNT, the controller 11 restarts supplying the internal power supply voltage VREG to the internal power circuit 13 by raising the gate voltage of the transistors TR5 and TR6 to level "H". The controller 11 then causes the boosting circuit 14 to output a voltage obtained by adding a voltage in which the internal power supply voltage VREG is boosted to the input VIN, and causes the switch controller 17 to drop the voltage VSW to level "L" so that the transistor 16 becomes an OFF-state. The voltage VG of the node ND1 then becomes, for example, 10V, the transistors 21 and 22 become an ON-state, and a current path is formed between the input VIN and the output VOUT.

[1-3] Advantage of Embodiment

The gate control circuit 10 according to the embodiment explained above is capable of suppressing the consumption current when in a gate-OFF state. Hereinafter, detailed advantages of the gate control circuit 10 according to the embodiment will be explained.

Figure 4:
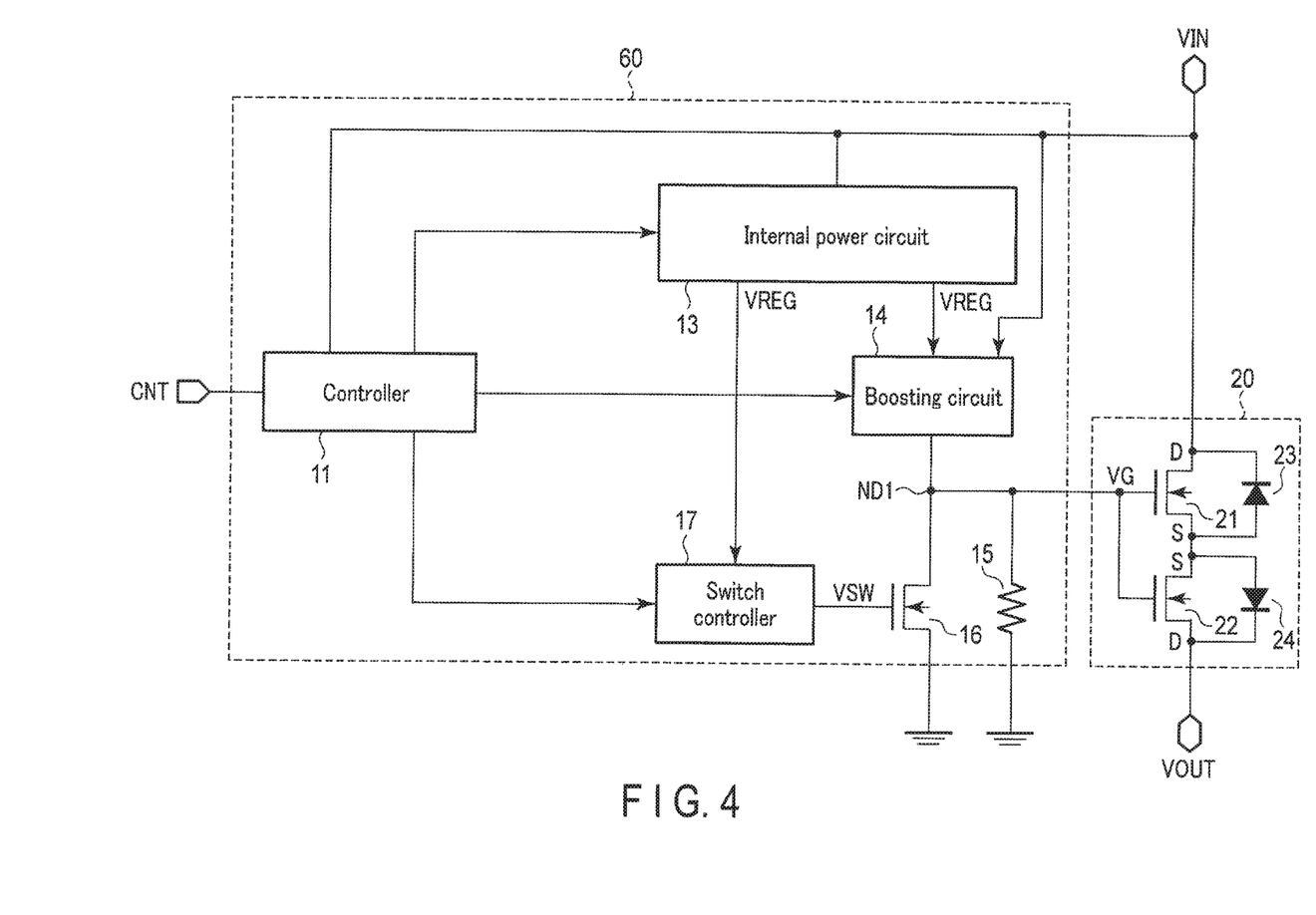
FIG. 4 is a block diagram showing a configuration example of a gate control circuit and an output part according to a comparative example of the embodiment.

A comparative example of a gate control circuit that controls a gate voltage of a MOSFET is shown in FIG. 4. As shown in FIG. 4, the configuration of a gate control circuit 60 according to the comparative example is the same as that obtained by omitting the delay circuit 12 and the VREG controller 30 in the configuration of the gate control circuit 10 according to the embodiment explained using FIG. 1. In other words, in the gate control circuit 60 according to the comparative example, for example, the VREG controller 30 of the internal power circuit 13 shown in FIG. 2 is omitted, and a node ND3 and a constant current source CC1 are connected directly. An example of an operation in the gate control circuit 60 according to this comparative example is shown in FIG. 5.

Figure 5:
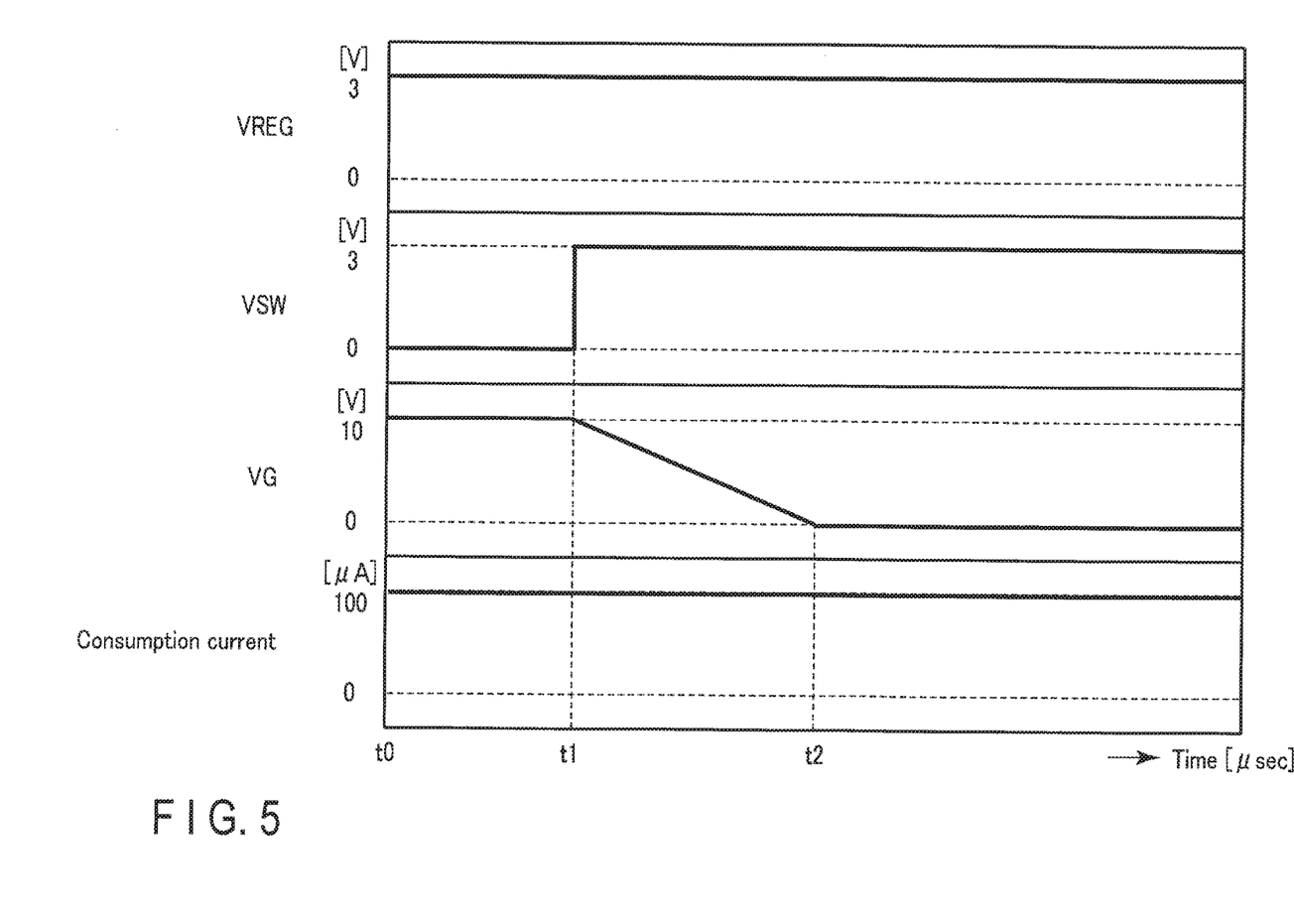
FIG. 5 is a timing chart showing an operation example of the gate control circuit according to the comparative example of the embodiment.

As shown in FIG. 5, the operation of the gate control circuit 60 according to the comparative example is different from the operation of the gate control circuit 10 according to the embodiment explained using FIG. 3, in that the waveform of a voltage VREG and the waveform of a consumption current required for the internal power supply activation of the gate control circuit 10 are different. Specifically, the gate control circuit 60 according to the comparative example maintains the internal power supply voltage VREG at, for example, 3V even after a voltage VSW is changed from level "L" to level "H". Furthermore, the consumption current that is required for the internal power supply activation of the gate control circuit 60 is maintained at, for example, around 100 μA even at time t2 and thereafter.

In the gate control circuit 10 according to the embodiment, the VREG controller 30 that is capable of controlling the ON/OFF of the internal power circuit 13, and the delay circuit 12 that delays the control signal S1 with respect to the VREG controller 30 are provided. Furthermore, in the gate control circuit 10 according to the embodiment, the delay time of the delay circuit 12 is configured to become longer than a time until the gate voltages VG of the transistors 21 and 22 fall, for example, from the internal power supply voltage VREG to the ground voltage, after the controller 11 is instructed by an external device to shift from a gate-ON state to a gate-OFF state. In other words, in the gate control circuit 10 according to the embodiment, the delay time of the delay circuit 12 is designed to become a time obtained by adding a margin to a time constant based on the gate voltage VG, the gate capacities of the transistors 21 and 22, and the ON-resistance of the transistor 16.

Based on the control signal S1 that has been delayed by the delay circuit 12, the VREG controller 30 stops supplying a current to the voltage supply circuit 31, the BGR circuit 32, and the LDO circuit 33 of the internal power circuit 13. That is, the delay circuit 12 and the VREG controller 30 in the embodiment are capable of stopping the operation of the internal power circuit 13 after the voltages VG of the transistors 21 and 22 drop to, for example, the ground voltage.

In the above manner, the gate control circuit 10 according to the embodiment is capable of suppressing the consumption current of the internal power circuit 13 after the transistors 21 and 22 of the output part 20 become an OFF-state. Therefore, the gate control circuit 10 according to the embodiment is capable of suppressing the power consumption of the gate control circuit 10 when in a gate-OFF state.

[2] MODIFIED EXAMPLE, ETC.

The gate control circuit 10 of the embodiment comprises a controller, a delay circuit, a power circuit, a boosting circuit, a first transistor, and a control circuit. The controller outputs first and second control signals based on a control signal from outside. The delay circuit delays the first control signal. The power circuit is capable of controlling a power supply voltage to be output based on the delayed first control signal. The boosting circuit is capable of boosting the input voltage and outputting it to a first node. The first transistor has one end connected to the first node, and the other end grounded. The control circuit is capable of controlling a gate voltage of the first transistor based on the second control signal. In this manner, a gate control circuit that is capable of suppressing a power consumption can be provided.

In the above embodiment, an example of a case in which the gate control circuit 10 and the output part 20 are configured separately has been explained; however, the embodiment is not limited thereto. For example, the gate control circuit 10 and the output part 20 may be configured as one module. In this case, the module obtained by combining the gate control circuit 10 and the output part 20 will be referred to as, for example, a load switch.

Figure 6:
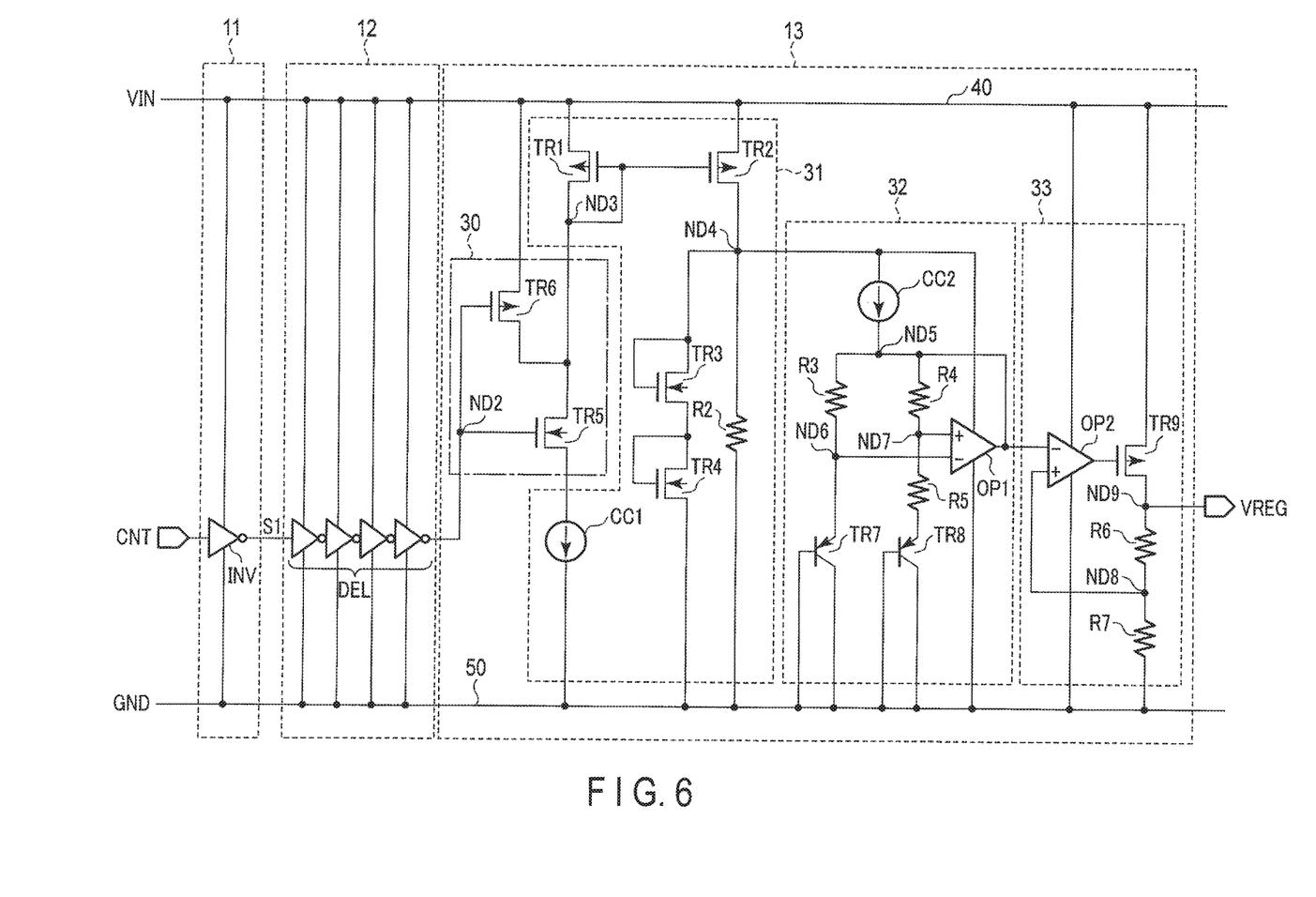
FIG. 6 and FIG. 7 show an example of a circuit configuration of a controller, a delay circuit, and an internal power circuit included in a gate control circuit according to modified examples of the embodiment.
Figure 7:
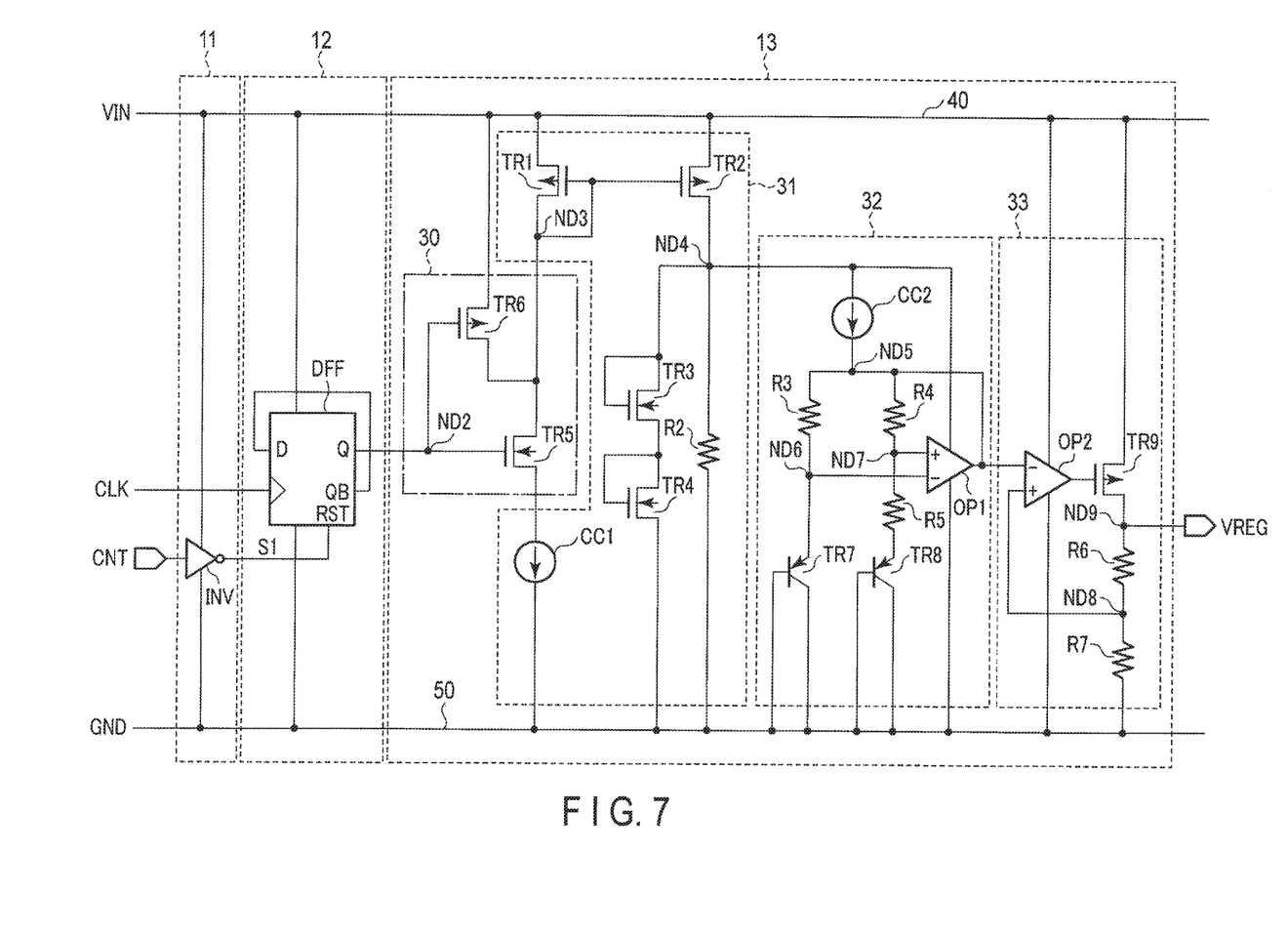

In the above-mentioned embodiment, a delay time of the delay circuit 12 is set by, for example, adjusting a resistance value of the resistor element R1 and a capacity of the capacitative element C1 that comprise the delay circuit 12. A configuration of the delay circuit 12 that generates a desired delay time is not limited to the above. The configuration of the delay circuit 12 may have configurations shown in, for example, FIG. 6 and FIG. 7. FIG. 6 and FIG. 7 show an example of circuit configurations of a controller 11, a delay circuit 12, and an internal power circuit 13 included in a gate control circuit 10 according to modified examples of the embodiment. The circuit configuration of the delay circuit 12 is different from the configuration explained using FIG. 2 in the embodiment.

The delay circuit 12 in the modified example shown in FIG. 6 includes an inverter set DEL. The inverter set DEL is configured, for example, by four inverters that are connected in series. The inverters included in the inverter set DEL operate based on a potential difference between a power supply wire 40 and a ground wire 50. A control signal S1 that is output from the controller 11 is input to an input of the inverter set DEL. The inverter set DEL outputs the control signal S1 that has been delayed by inverting it four times to a VREG controller 30. The number of inverters INV included in the inverter set DEL is not limited to the above. The inverter set DEL may be configured by even numbers of inverters that are connected in series.

Figure 8:
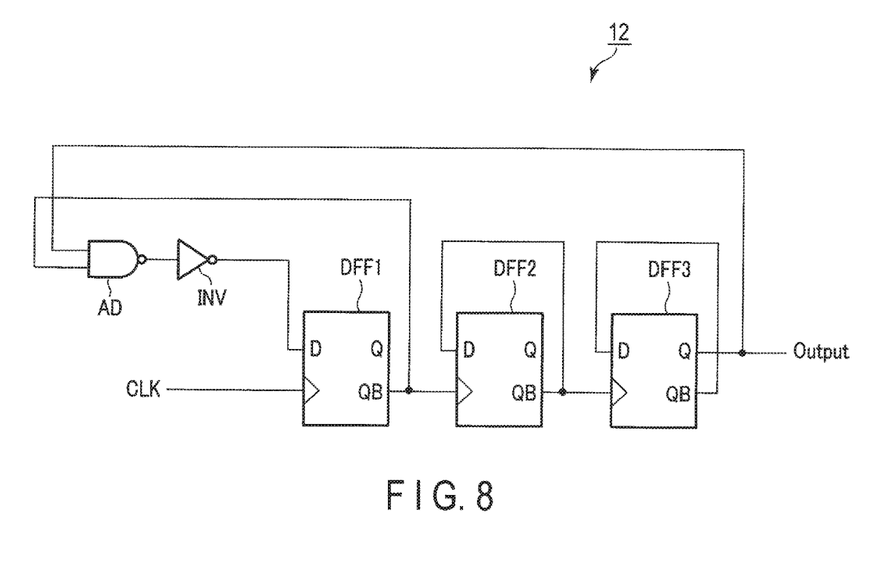
FIG. 8 shows an example of the delay circuit included in the gate control circuit according to a modified example of the embodiment.

A delay circuit 12 in the modified example shown in FIG. 7 includes a D-type flip-flop circuit DFF. A clock signal CLK of an unillustrated oscillator circuit is input to a clock of the D-type flip-flop circuit DFF, a control signal S1 is input to a reset RST, an input D is connected to an output QB, and an output Q is connected to a node ND2. For example, the D-type flip-flop circuit DFF starts a count on the clock signal CLK when the control signal S1 transitions from level "H" to level "L", and, after the clock signal CLK is counted, causes the output Q to become level "H". In other words, the output Q of the D-type flip-flop circuit DFF corresponds to the output of the delayed control signal S1. In such delay circuit 12, a time corresponding to a product of a pulse width and a number of counts of the clock signal CLK becomes the delay time. In the case of increasing the number of counts, a plurality of D-type flip-flop circuits DFF are connected in series as shown in FIG. 8. FIG. 8 shows an example of a case in which three D-type flip-flop circuits are connected in series in the delay circuit 12.

As shown in FIG. 8, in the case where D-type flip-flop circuits DFF 1 to DFF 3 are connected in series, the delay circuit 12 further includes an NAND circuit AD and an inverter INV. An output QB of the flip-flop circuit DFF 1 is input to a first input terminal of the NAND circuit AD, and an output of the NAND circuit AD is input to the inverter INV. An output of the inverter INV is input to an input D of the flip-flop circuit DFF 1. The output QB of the flip-flop circuit DFF 1 is input to a clock of the flip-flop circuit DFF 2, and an output QB of the flip-flop circuit DFF 2 is connected to a clock of the flip-flop circuit DFF 3. An output Q of the flip-flop circuit DFF 3 corresponds to an output of the delay circuit 12, and is further input to a second input terminal of the NAND circuit AD. The other connection relationships are the same as those of the D-type flip-flop circuit DFF shown in FIG. 7. In such a circuit configuration, the number of counts of the delay circuit 12 becomes eight times (2 to the 3rd power). For example, in the delay circuit 12, when the frequency of the oscillator circuit is 50 kHz, and the number of counts obtained by connecting six D-type flip-flop circuits DFF in series is 64 (2 to the 6th power), the pulse width of the clock signal CLK becomes 10 us, and the delay time thereof becomes 10 us×64=640 us. In the manner above, circuits of various configurations can be applied to the delay circuit 12 in the embodiment.

In the above-described embodiment, the transistors in each circuit have been explained by assuming that they are an NMOS transistor or a PMOS transistor; however, the transistors are not limited thereto. For example, the transistor 16 can also be configured by the PMOS transistor. The operation of the switch controller 17 in this case is what has the voltage VSW inversed in the operation explained using FIG. 3.

In this specification, the term "connection" means electrical connection, and does not exclude a case in which, for example, elements are connected via another element. Furthermore, in this specification, the term "block" means that the switch is in an OFF-state, and does not exclude a case in which, for example, a minute current such as a leak current of the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A gate control circuit comprising:
a controller that outputs each of first and second control signals based on a control signal from outside;
a delay circuit that delays the first control signal;
a power circuit that generates a power supply voltage from an input voltage from outside, and controls the power supply voltage to be output based on the delayed first control signal;
a boosting circuit that boosts and outputs a voltage input thereto;
a first transistor that has one end connected to an output node of the boosting circuit, and another end grounded; and
a control circuit that controls a gate voltage of the first transistor based on the second control signal,
wherein:
the power circuit includes second to fifth transistors,
one end of each of the second and the third transistors is connected respectively to a power supply wire on which the input voltage is applied, and a gate of the second transistor is connected to a gate of the third transistor and another end of the second transistor, and
one end of the fourth transistor is connected to the another end of the second transistor, another end of the fourth transistor is connected to a around wire, one end of the fifth transistor is connected to the power supply wire, another end of the fifth transistor is connected to the one end of the fourth transistor, and the delayed first control signal is input to a gate of each of the fourth and the fifth transistors.

2. The circuit of claim 1, wherein:
when the control circuit changes a gate voltage of the first transistor from a first logic level to a second logic level based on the second control signal, a voltage of the output node drops from a first voltage, and
after the voltage of the output node drops from the first voltage to a second voltage, the power circuit suppresses an output of the power supply voltage based on the delayed first control signal.

3. The circuit of claim 2, wherein the voltage to be boosted by the boosting voltage is the input voltage.

4. The circuit of claim 2, wherein the first transistor is an NMOS transistor.

5. The circuit of claim 1, wherein the delay circuit is configured by a resistor element and a capacitative element.

6. The circuit of claim 1, wherein the delay circuit is configured by an even number of inverters that are connected in series.

7. The circuit of claim 1, wherein the delay circuit is configured by a D-type flip-flop circuit.

8. The circuit of claim 1, wherein the power circuit generates the power supply voltage based on a current flowing between the one end and another end of the third transistor.

9. The circuit of claim 1, wherein the power circuit further includes a constant current source connected between the another end of the fourth transistor and the ground wire.

10. The circuit of claim 1, wherein:
- when the control circuit changes a gate voltage of the first transistor from a first logic level to a second logic level based on the second control signal, a voltage of the output node drops from a first voltage,
- after the voltage of the output node drops from the first voltage to a second voltage, the delayed first control signal changes from the first logic level to the second logic level, and
- the power circuit suppresses an output of the power supply voltage based on a change of the delayed first control signal from the first logic level to the second logic level.

11. The circuit of claim 10, wherein the voltage to be boosted by the boosting voltage is the input voltage.

12. The circuit of claim 10, wherein:
- each of the first transistor and the fourth transistor is an NMOS transistor, and
- each of the second transistor, the third transistor, and the fifth transistor is a PMOS transistor.

* * * * *